United States Patent
Zheng

(10) Patent No.: US 7,873,897 B2
(45) Date of Patent: Jan. 18, 2011

(54) DEVICES AND METHODS FOR BIT-LEVEL CODING AND DECODING OF TURBO CODES

(75) Inventor: Yan-Xiu Zheng, Shulin (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 317 days.

(21) Appl. No.: 12/203,709

(22) Filed: Sep. 3, 2008

(65) Prior Publication Data

US 2009/0077431 A1    Mar. 19, 2009

Related U.S. Application Data

(60) Provisional application No. 60/973,153, filed on Sep. 17, 2007.

(51) Int. Cl.
 *H03M 13/03* (2006.01)
(52) U.S. Cl. ...................................... 714/786; 714/701
(58) Field of Classification Search ................. 714/778, 714/795, 786, 701; 375/267, 222; 455/446
 See application file for complete search history.

(56) References Cited

U.S. PATENT DOCUMENTS

| 6,782,504 | B1 | 8/2004 | Berrou et al. | |
|---|---|---|---|---|
| 7,237,180 | B1* | 6/2007 | Shao et al. | 714/778 |
| 7,436,895 | B1* | 10/2008 | Tujkovic | 375/267 |
| 2002/0101915 | A1* | 8/2002 | Zhang et al. | 375/222 |
| 2007/0083803 | A1 | 4/2007 | Chen et al. | |
| 2007/0109953 | A1 | 5/2007 | Blankenship et al. | |
| 2007/0220409 | A1* | 9/2007 | Shao et al. | 714/795 |
| 2008/0311918 | A1* | 12/2008 | Spencer | 455/446 |

OTHER PUBLICATIONS

Sklar, Bernard, "Fundamental of Turbo Codes", retrieved from the Internet on Aug. 4, 2008 http://www.informit.com/content/images/art_sklar3_turbocodes/elementLinks/art_sklar3_turbocodes.pdf.
Rekh, Shobha, et al., "Optimal choice of interleaver for turbo codes", Academic Open Internet Journal, www.acadjournal.com, vol. 15, 2005.

* cited by examiner

*Primary Examiner*—David Ton
(74) *Attorney, Agent, or Firm*—Finnegan, Henderson, Farabow, Garrett & Dunner, LLP

(57) ABSTRACT

A bit-level turbo code encoder is provided. The bit-level turbo code encoder is configured to receive a first input data sequence and generate a first output data sequence. The bit-level turbo code encoder includes a first non-binary convolutional code encoder, a bit-level interleaver, and a second non-binary convolutional code encoder. The first non-binary convolutional code encoder is configured to process the first input data sequence and generate a second output data sequence. The bit-level interleaver is configured to receive the first input data sequence as a first sequence and interleave the first sequence at bit level to generate a fourth sequence. The second non-binary convolutional code encoder is coupled with the bit-level interleaver and configured to receive the fourth sequence and process the fourth sequence to generate a third output data sequence.

37 Claims, 8 Drawing Sheets

US 7,873,897 B2

DEVICES AND METHODS FOR BIT-LEVEL CODING AND DECODING OF TURBO CODES

PRIORITY

This application claims the benefit of priority of U.S. Provisional Application No. 60/973,153, filed Sep. 17, 2007.

TECHNICAL FIELD

The present disclosure relates generally to wireless communications and, more particularly, to devices and methods for bit-level coding and decoding of turbo codes in wireless communications.

BACKGROUND

In a modern communication system, signals may be transmitted from a source location to a destination location in analog or digital forms. Digital data communication has become more and more popular due to its various advantages in various applications. For example, it may offer increased capacity of data transmission, increased flexibility of data manipulation, etc. A signal that contains data derived from an image, a speech, etc., are typically encoded into sequences of symbols or binary symbols, which are then transmitted from a transmitter to a receiver through a data communication channel, e.g., via a cable or over-the-air. When transmitted through the communication channel, signals may be susceptible to interferences or noises, which may cause errors in the information on the receiver.

Certain techniques were developed to reduce data transmission errors in communication or to improve reliability of data communication. One example uses turbo codes, which may offer the performance approaching the Shannon limit, a theoretical limit for the maximum data transmission rate when data is transmitted over a noisy channel.

FIG. 1 illustrates a conventional non-binary (i.e., symbol-level) turbo code encoder 10 known in the prior art. Encoder 10 may include a grouping circuit 20, a permutation block 30, a modification block 40, a first non-binary convolutional code encoder 50 ($C_1$), and a second non-binary convolutional code encoder 60 ($C_2$). In FIG. 1, permutation block 30 and modification block 40 form a symbol-level interleaver, which processes input sequence $u_0$ by symbols.

For example, an input sequence $u_0$ having n binary bits may be grouped into $N=n/W$ symbols (n and W both being positive integers, and typically n>W, and n being dividable by W) by the grouping circuit 20. Each symbol may include W binary bits from the input sequence $u_0$. The grouped input sequence $u_0$ may be directed through various circuits for processing. For example, the input sequence $u_0$ may be directly output as an output sequence $Y_0$ ($Y_0 = u_0$) without any treatment. The input sequence $u_0$ may also be directed to the first non-binary convolutional code encoder 50 ($C_1$), where the input sequence $u_0$ may be transformed and output as an output sequence $Y_1$, which may have m bits (m may be a different integer from n, e.g., m>n). The input sequence $u_0$ may further be directed to the permutation block 30 and the modification block 40 before being directed to the second non-binary convolutional code encoder 60 ($C_2$). The second non-binary convolutional code encoder 60 ($C_2$) may transform the sequence $u_2$ and output the transformed sequence as an output sequence $Y_2$, which may have m bits.

In the permutation block 30, the n/W symbols of the input sequence $u_0$ may be permuted, the details of which will be discussed below. After permutation, the input sequence $u_0$ may become a permuted sequence $u_1$. Symbols in the permuted sequence us may be selectively modified by the modification block 40 according to a predetermined rule, which will be discussed in detail below. After the modification process, the sequence $u_1$ may become a modified sequence $u_2$. Finally, the modified sequence $u_2$ may be directed into the second non-binary convolutional code encoders 60 ($C_2$) for further processing.

A sequence $u_0$ of n binary bits may be transformed into a sequence of m binary bits after being processed by the first and second encoders 50 ($C_1$) and 60 ($C_2$), where m>n, and the ratio of n/m is known as "code rate." The first and second non-binary convolutional code encoders 50 ($C_1$) and 60 ($C_2$) may be structurally identical to each other, or different from each other. The first and second non-binary convolutional code encoders 50 ($C_1$) and 60 ($C_2$) may be implemented with different algorithms. For example, in some applications, the first non-binary convolutional code encoder 50 ($C_1$) may output an output sequence $Y_1$ with $m_1$ bits (not shown in FIG. 1) and the second non-binary convolutional code encoder 60 ($C_2$) may output an output sequence $Y_2$ with $m_2$ bits, where $m_1$ may be different from $m_2$. Therefore, in some embodiments, the first and second non-binary convolutional code encoders 50 ($C_1$) and 60 ($C_2$) may have different code rates. Since the first and second non-binary convolutional code encoders 50 ($C_1$) and 60 ($C_2$) are well known in the art, their details are not discussed herein.

FIG. 2 shows a diagram illustrating a non-binary turbo code encoder 70 with W=2 for a non-binary (symbol-level) turbo code defined in standards such as IEEE 802.16, DVB-RCS/RCT, etc. The input of the non-binary turbo code encoder 70 is a non-binary symbol, denoted as $S_m$, which may include a pair of data (A, B), where A and B are data units. An interleaver 80 of the non-binary turbo code encoder 70 may be a symbol-level interleaver, which may include the permutation block 30 and the modification block 40 shown in FIG. 1. The interleaver 80 may perform intra-symbol permutations or inter-symbol permutations. An intra-symbol permutation refers to a permutation within a symbol. For example, the data pair (A, B) may be permutated via an intra-symbol permutation to become another data pair (B, A). An inter-symbol permutation means a permutation between symbols. For example, a sequence containing a plurality of symbols [$S_{m,0}$, $S_{m,1}$, ..., $S_{m,N-1}$] may be permutated to become another sequence containing the same symbols but arranged in a different order, e.g., [$S_{m,0}$, $S_{m,4}$, $S_{m,8}$, ..., $S_{m,k}$], where k is a number from 0, 1, 2, ..., N−1, and is determined based on a predetermined rule or algorithm.

Table 1 shows a conventional non-binary MAP algorithm known in the art, which may be implemented in the symbol-level interleaver 80. The algorithm includes two steps. Step 1 performs the intra-symbol permutation, for example, via the permutation block 30, and Step 2 performs the inter-symbol permutation using "Almost Regular Permutation (ARP)," for example, via the modification block 40. Before Step 1, a first sequence $u_0$ may have already been grouped by the grouping circuit 20 shown in FIG. 1 into $u_0=[(A_0, B_0), (A_1, B_1), (A_2, B_2), (A_3, B_3), \ldots, (A_{N-1}, B_{N-1})]$, where data pair $(A_i, B_i)$ includes a first data unit $A_i$ and a second data unit $B_i$. In Step 1, each data pair $(A_i, B_i)$ in the first sequence $u_0$ is permuted between the first and second data units $A_i$ and $B_i$, i.e., $(A_i, B_i) \rightarrow (B_i, A_i)$, if the condition (i mod 2=1) is satisfied, i=0, 1, 2, ..., N−1. After permutation, a second sequence $u_1$ may be generated from the first sequence $u_0$. In Step 2, inter-symbol permutation is conducted. The $j^{th}$ data pair of a third interleaved sequence $u_2$ is formed by the $P(j)^{th}$ data pair, which may be $(A_j, B_j)$ or $(B_j, A_j)$, of the second sequence $u_1$, where P(j) is a mapping function providing a corresponding coordinate (i.e., address) of the $j^{th}$ data pair of the third sequence $u_2$ in the second sequence $u_1$. For an IEEE 802.16 symbol-level interleaver, the parameters $P_0$, $P_1$, $P_2$, $P_3$ used in the mapping function P(j) are constants known in the art, which are shown in Table 2.

TABLE 1

IEEE 802.16 Symbol-Level Interleaver (Prior Art)

Step 1: Switch alternate data pairs
    Let the sequence $u_0 = [(A_0,B_0), (A_1,B_1), (A_2,B_2), (A_3,B_3), ..., (A_{N-1},B_{N-1})]$ be the input to
    first encoder $C_1$.
    for i=0, 1,..., N−1
    if ( (i mod 2) = 1), let $(A_i,B_i) \rightarrow (B_i,A_i)$ (i.e., switch the data pair)
    This step gives a sequence $u_1=[(A_0,B_0),(B_1,A_1),(A_2,B_2),...,(B_{N-1},A_{N-1})]=[u_1(0),u_1(1),u_1(2),$
    $u_1(3), ...,u_1(N-1)]$.
Step 2: P(j)
    The function P(j) provides the coordinate (i.e., address) of the data pair of the sequence
    $u_1$ that is mapped onto the coordinate (i.e., address) $j^{th}$ data pair of an interleaved
    sequence $u_2$ (i.e., $u_2(j) = u_1(P(j))$).
    for j=0, 1,..., N−1
    switch (j mod 4) :
    case 0: $P(j)= (P_0j +1) \bmod N$
    case 1: $P(j)= (P_0j +1+N/2+P_1) \bmod N$
    case 2: $P(j)= (P_0j +1+P_2) \bmod N$
    case 3: $P(j)= (P_0j +1+N/2+P_3) \bmod N$
    This step gives sequence $u_2=[u_1(P(0)),u_1(P(1)),u_1(P(2)),u_1(P(3)),...,u_1(P(N-1))]=$
    $[(B_{P(0)},A_{P(0)}), (A_{P(1)},B_{P(1)}),(B_{P(2)},A_{P(2)}),(A_{P(3)},B_{P(3)}),...,(A_{P(N-1)},B_{P(N-1)})]$. Sequence $u_2$ is the
    input to second encoder $C_2$.

TABLE 2

Parameters for IEEE 802.16 Convolutional Turbo Code Interleaver (Prior Art)

| Interleaver Length (Bytes) | $P_0$ | $P_1$ | $P_2$ | $P_3$ |
|---|---|---|---|---|
| 6 | 5 | 0 | 0 | 0 |
| 9 | 11 | 18 | 0 | 18 |
| 12 | 13 | 24 | 0 | 24 |
| 18 | 11 | 6 | 0 | 6 |
| 24 | 7 | 48 | 24 | 72 |
| 27 | 11 | 54 | 56 | 2 |
| 30 | 13 | 60 | 0 | 60 |
| 36 | 17 | 74 | 72 | 2 |
| 45 | 11 | 90 | 0 | 90 |
| 48 | 11 | 96 | 48 | 144 |
| 54 | 13 | 108 | 0 | 108 |
| 60 | 13 | 120 | 60 | 180 |
| 120 | 53 | 62 | 12 | 2 |
| 240 | 43 | 64 | 300 | 824 |
| 360 | 43 | 720 | 360 | 540 |
| 480 | 31 | 8 | 24 | 16 |
| 600 | 53 | 66 | 24 | 2 |

In a symbol-level interleaver design, the algorithm shown in Table 1 may require extra memory space for storing extrinsic information and a priori information generated during data processing in the decoder. As a result, the symbol-level interleaver 80 leads to higher complexity in decoder and may result in performance degradation in some applications in terms of higher error rates.

The disclosed embodiments may be directed to provide improvement(s) or alternative(s) to existing technology in certain data communication applications.

SUMMARY

In one exemplary embodiment, the present disclosure is directed to a bit-level turbo code encoder. The bit-level turbo code encoder is configured to receive a first input data sequence and generate a first output data sequence. The bit-level turbo code encoder includes a first non-binary convolutional code encoder, a bit-level interleaver, and a second non-binary convolutional code encoder. The first non-binary convolutional code encoder is configured to process the first input data sequence and generate a second output data sequence. The bit-level interleaver is configured to receive the first input data sequence as a first sequence and interleave the first sequence at bit level to generate a fourth sequence. The second non-binary convolutional code encoder is coupled with the bit-level interleaver and configured to receive the fourth sequence and process the fourth sequence to generate a third output data sequence.

In one exemplary embodiment, the present disclosure is directed to a bit-level inter-block permutation interleaving method. The bit-level inter-block permutation interleaving method includes receiving a first data sequence comprising a first plurality of groups of data, each group having at least two units of data; altering a sequence of data units within at least one group of the first plurality of groups of data to generate a second data sequence comprising a second plurality of groups of data; and mapping the data of the second plurality of groups into an interleaved sequence to generate a third data sequence comprising a third plurality of groups of data. The bit-level inter-block permutation interleaving also include performing an inter-block permutation to the third plurality of groups of data to generate a fourth data sequence comprising a fourth plurality of groups of data; and outputting the fourth plurality of groups of data as data having error-correction codes configured to allow error correction to a receiving end.

In one exemplary embodiment, the present disclosure is directed to a set of instructions recognizable by a data processing device, such as a bit-level turbo code encoder. The instructions configure the data processing device to perform operations of: receiving a first data sequence comprising a first plurality of groups of data, each group having at least two units of data; altering a sequence of data units within at least one group of the first plurality of groups of data to generate a second data sequence comprising a second plurality of groups of data; and mapping the data of the second plurality of groups into an interleaved sequence to generate a third data sequence comprising a third plurality of groups of data. The operations may also include: performing an inter-block permutation to the third plurality of groups of data to generate a fourth data sequence comprising a fourth plurality of groups of data; and outputting the fourth plurality of groups of data as data having error-correction codes configured to allow error correction to a receiving end.

In one exemplary embodiment, the present disclosure is directed to a bit-level turbo decoder. The bit-level turbo decoder comprises at least one non-binary convolutional code decoder configured to decode a data sequence to generate extrinsic information. The bit-level turbo decoder also comprises at least one bit-level interleaver coupled with the at least one non-binary convolutional code decoder and configured to interleave the extrinsic information. The bit-level turbo decoder further comprises at least one bit-level de-interleaver coupled with the at least one non-binary convolutional code decoder and configured to perform a reversed operation of bit-level interleaving to the extrinsic information generated by the at least one non-binary convolutional code decoder.

DETAILED DESCRIPTION

Figure 1:
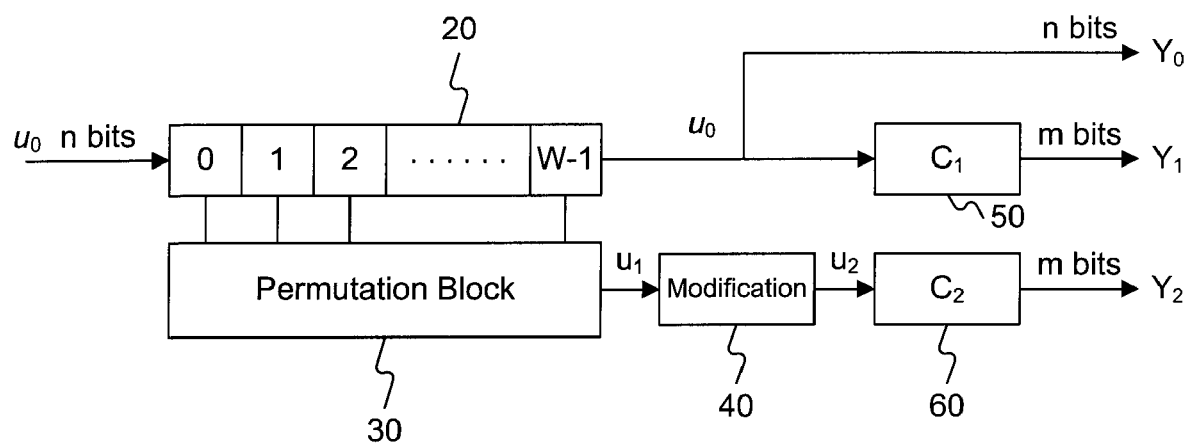
FIG. 1 is a diagrammatic illustration of a conventional non-binary turbo code encoder known in the prior art.
Figure 2:
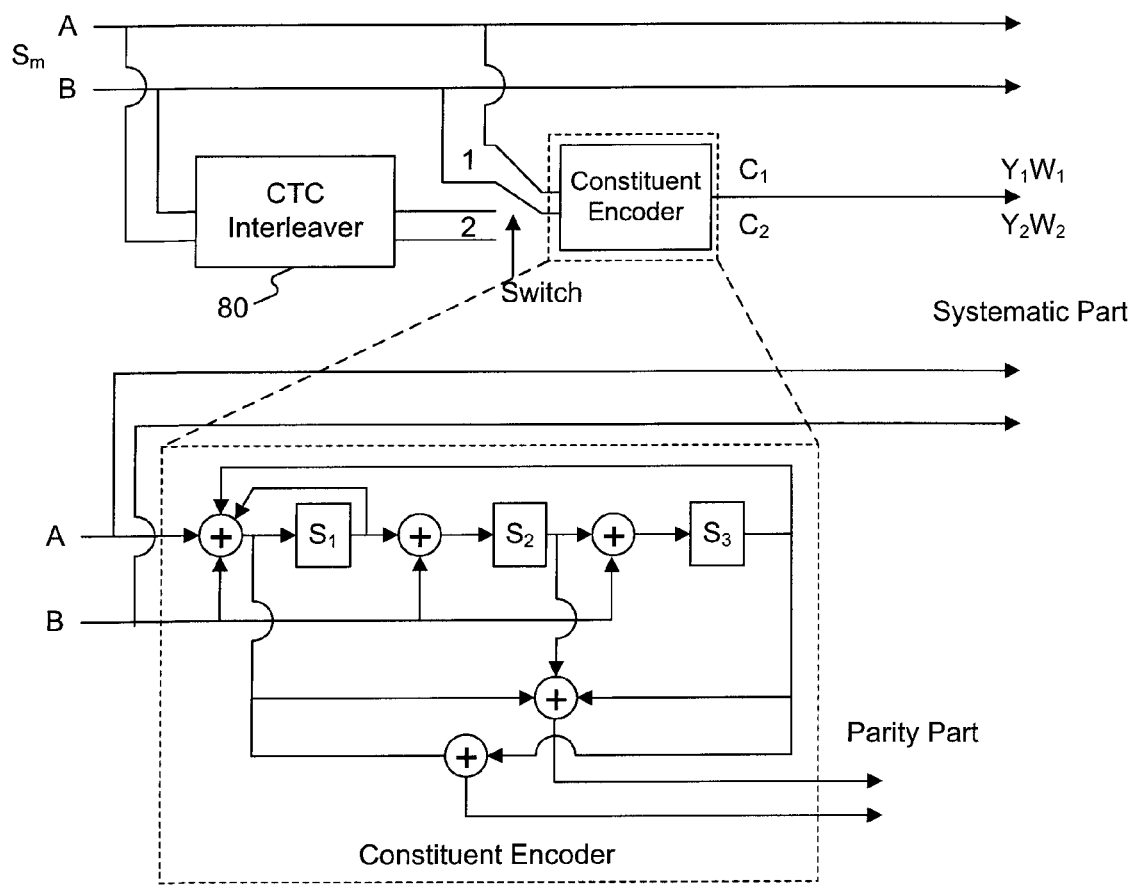
FIG. 2 is a diagrammatic illustration of a turbo code encoder in IEEE 802.16 standard known in the prior art.

A bit-level interleaver may permute multiple bits within a symbol to different symbols. There may be two exemplary types of bit-level interleavers. The first type of bit-level interleavers may apply bit-level permutation functions such as Quadratic Polynomial Permutation (QPP) in Eq. (1) or ARP in Eq. (2). The second type of bit-level interleavers may apply bit-level inter-block permutation to inter-connect a plurality of identical or non-identical symbol-level interleavers. This invention is generally related to the turbo encoder applying bit-level interleavers. Table 3 shows an exemplary algorithm that may be implemented in a disclosed bit-level interleaver. The disclosed bit-level interleaver may adopt a conventional symbol-level interleaver defined in IEEE 802.16 standard, and modify the conventional symbol-level interleaver by adding an extra step, an inter-block permutation step (Step 3 in Table 3). The inter-block permutation function IBP(i, j) used in the inter-block permutation can be any one of Eqs. (3)-(7). The parameters used in the Eqs. (3)-(7), such as $P_0, P_1, P_2, P_3$, A, α, β, and c are known in the art for a symbol-level interleaver, and may be reused in a bit-level interleaver design. An exemplary set of new parameters P and M for the bit-level interleaver design is shown in Table 4. The algorithm shown in Table 3 will be discussed in detail below.

$$\pi_{QPP}(i) = f_2 i^2 + f_1 i \bmod n \quad (1)$$

$$\pi_{ARP}(i) = iP_0 + A + P_0\alpha(i \bmod c) + \beta(i \bmod c) \bmod n \quad (2)$$

$$IBP(i, j) = (i + Pj) \bmod M \quad (3)$$

$$IBP(i, j) = (i + f_2 j^2 + f_1 j) \bmod M \quad (4)$$

$$IBP(i, j) = (i + jP + A + P\alpha(j \bmod c) + \beta(j \bmod c)) \bmod M \quad (5)$$

$$IBP(i, j) = \left(1 + jP - \frac{j - (j \bmod q)}{q}\right) \bmod M, \ q = \frac{P}{\gcd(P, M)} \quad (6)$$

$$IBP(i, j) = \left(i + jP + \frac{j - (j \bmod q)}{q}\right) \bmod M, \ q = \frac{P}{\gcd(P, M)} \quad (7)$$

where gcd(P, M) is the greatest common divisor.

TABLE 3

Algorithm for an Exemplary Bit-Level Interleaver.

Step 1: Switch alternate data pairs
    Let a first sequence be $u_0=[u_{0,0}, u_{0,1}, u_{0,2},..., u_{0,M-1}]$, which may be the input to a first encoder $C_1$, where
    $u_{0,k}=[(A_{(k,0)},B_{(k,0)}), (A_{(k,1)},B_{(k,1)}), (A_{(k,2)},B_{(k,2)}), ...,(B_{(k,N-1)},A_{(k,N-1)})]$
    for k=0, 1,...,M−1
        for j=0, 1,...,N−1
            if ( (j mod 2) =1), let $(A_{(k,j)}, B_{(k,j)}) \to (B_{(k,j)}, A_{(k,j)})$ (i.e., switch the data pair)
    This step provides a second sequence $u_1=[u_{1,0},u_{1,1},u_{1,2},...,u_{1,M-1}]$, where $u_{1,k}$
    $=[(A_{(k,0)},B_{(k,0)}),(B_{(k,1)},A_{(k,1)}),(A_{(k,2)}, B_{(k,2)}),...,(B_{(k,N-1)},A_{(k,N-1)})]$
    $=[u_{1,k}(0),u_{1,k}(1),u_{1,k}(2),...,u_{1,k}(N-1)]$.
Step 2: P(j)
    The function P(j) provides the coordinate of the data pair of the second sequence $u_{1,k}$
    that is mapped onto the coordinate j of an interleaved third sequence $u_2$
    (i.e., $u_{2,k}(j)= u_{1,k}(P(j))$).
    for j=0,1,...,N−1

TABLE 3-continued

Algorithm for an Exemplary Bit-Level Interleaver.

switch (j mod 4) :
        case 0: P(j)= ($P_0$j +1) mod N
        case 1: P(j)= ($P_0$j +1+N/2+$P_1$) mod N
        case 2: P(j)= ($P_0$j +1+$P_2$) mod N
        case 3: P(j)= ($P_0$j +1+N/2+$P_3$) mod N
This step provides the third sequence $u_2=[u_{2,0},u_{2,1},u_{2,2},...u_{2,M-1}]$, where $u_{2,k}=[u_{1,k}(P(0)),$
$u_{1,k}(P(1)), u_{1,k}(P(2)), u_{1,k}(P(3)), ... ,u_{1,k}(P(N-1))] = [(B_{(k,P(0))}, A_{(k,P(0))}), (A_{(k,P(1))}, B_{(k,P(1))}),$
$(B_{(k,P(2))}, A_{(k,P(2))}), (A_{(k,P(3))}, B_{(k,P(3))}), ... , (A_{(k,P(N-1))}, B_{(k,P(N-1))})] =[u_2(k,0), u_2(k,1), u_2(k,2),$
$... , u_2(k,2N-2), u_2(k,2N-1)]$.
Step 3: Inter-block permutation
    The inter-block permutation function IBP(i,j) provides the coordinate (i.e., address) of
    a component in the third sequence $u_2$ that is mapped onto the coordinate (i.e., address)
    (i,j) of a fourth sequence $u_3$, i.e.,
    for i=0,1,...,M-1
        for j=0,1,...,2N-1
            $u_3(i,j)= u_2(IBP(i,j),j);$
    This step provides the fourth sequence $u_3 = [u_{3,0},u_{3,1},u_{3,2},...,u_{3,M-1}]$, where
    $u_{3,k}=[u_2(IBP(k,0), 0),u_2(IBP(k,1), 1),u_2(IBP(k,2), 2),..., u_2(IBP(k,2N-2), 2N-2),$
    $u_2(IBP(k,2N-1), 2N-1)] =[(B_{(IBP(k,0),P(0))}, A_{(IBP(k,0),P(0))}), (A_{(IBP(k,2),P(1))}, B_{(IBP(k,3),P(1))}),$
    $(B_{(IBP(k,4),P(2))}, A_{(IBP(k,5),P(2))}), ..., (A_{(IBP(k,2N-2),P(N-1))}, B_{(IBP(k,2N-1),P(N-1))})]$. The fourth
    sequence
    $u_3$ may be the input to a second encoder $C_2$.

Figure 3A:
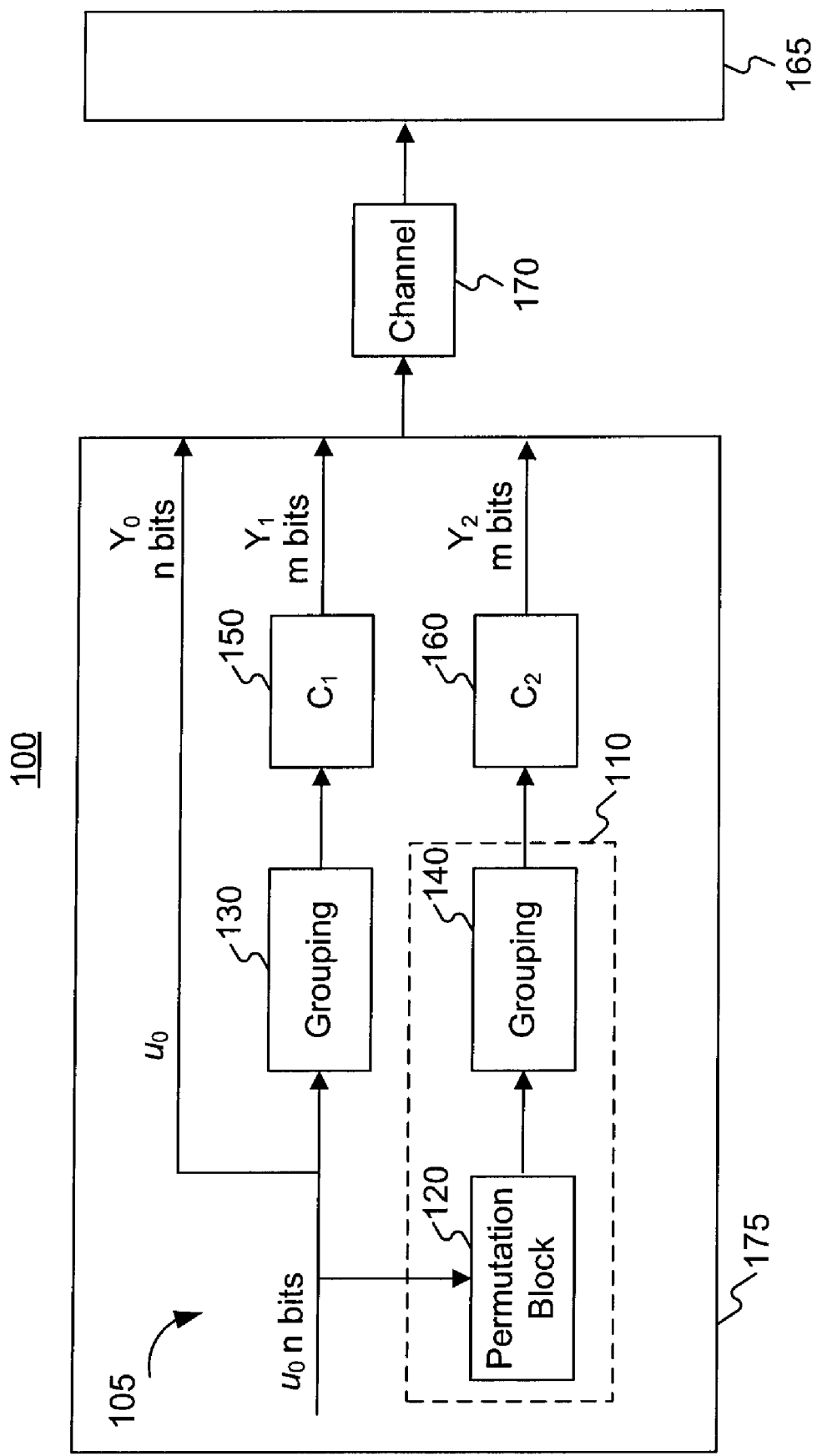
FIG. 3A is a block diagram of an exemplary communication system including a turbo code encoder where a disclosed bit-level interleaver may be employed, consistent with certain disclosed embodiments.

FIG. 3A illustrates an exemplary communication system 100, where the disclosed bit-level interleaver may be employed. The communication system 100 may include a transmitter 175, a channel 170, and a communication-signal receiving device 165. The transmitter 175 may receive an input signal containing a data sequence, and may process the data sequence at symbol-level or at bit-level, or at both levels, and subsequently transmit the processed data sequence to the communication-signal receiving device 165 through the channel 170.

The transmitter 175 may include a bit-level turbo code encoder 105 where the disclosed bit-level interleaver may be implemented. The turbo code encoder 105 may be configured to receive a first input data sequence $u_0$ and generate a first output sequence $Y_0$. The turbo code encoder 105 may include a first non-binary convolutional code encoder 150 ($C_1$). The first non-binary convolutional code encoder 150 ($C_1$) may be configured to configured to receive and process the first input data sequence $u_0$ and generate a second output data sequence $Y_1$. The bit-level turbo code encoder 105 may also include a bit-level interleaver 110. The bit-level interleaver 110 may be configured to receive the first input data sequence as a first sequence and interleave the first sequence at bit level to generate a fourth sequence, which will be discussed in detail below. The turbo code encoder 105 may also include a second non-binary convolutional code encoder 160 ($C_2$) coupled with the bit-level interleaver 110. The second non-binary convolutional code encoder 160 ($C_2$) may be configured to receive the fourth sequence generated by the bit-level interleaver 110 and process the fourth sequence to generate a third output data sequence $Y_2$.

The bit-level turbo code encoder 5 may include a first grouping block 130 coupled with the first non-binary convolutional code encoder 150 ($C_1$), and a second grouping block 140 coupled with at least one of the bit-level interleaver 110 and the second non-binary convolutional code encoder 160 ($C_2$). The first and second grouping blocks 130 and 140 may each be configured to group data (e.g., binary bits) into data pairs (or data groups). The first and second non-binary convolutional code encoders 150 ($C_1$) and 160 ($C_2$) may be similar to the first and second non-binary convolutional code encoders 50 ($C_1$) and 60 ($C_2$), and therefore are not discussed in detail herein. The first and second non-binary convolutional code encoders 150 ($C_1$) and 160 ($C_2$) may be structurally and functionally similar to each other. The bit-level interleaver 110 may also include a permutation block 120.

The bit-level turbo code encoder 105 may process an input data sequence $u_0$ to generate a plurality of output data sequences. As shown in FIG. 3A, the input sequence $u_0$ containing n bits may be directed to multiple data channels where the input sequence $u_0$ may be processed and may become multiple output data sequences, e.g., the first output sequence $Y_0$, the second output sequence $Y_1$, and the third output sequence $Y_2$. The input sequence $u_0$ may directly become the first output sequence $Y_0$ without being processed. That is, $Y_0=u_0$. The input sequence $u_0$ may also be grouped by the first grouping block 130 and encoded by the first non-binary convolutional code encoder 150 ($C_1$). The first non-binary convolutional code encoder 150 ($C_1$) may convert the input sequence $u_0$ into the second output sequence $Y_1$. The input sequence $u_0$ may also be directed to the bit-level interleaver 110, where $u_0$ may be interleaved according to a predetermined algorithm implemented within the bit-level interleaver 110, e.g., the exemplary algorithm shown in Table 3. The input sequence $u_0$, after being interleaved by the bit-level interleaver 110, may further be encoded by the second non-binary convolutional code encoder 160 ($C_2$), which may convert the input sequence $u_0$ into the third output sequence $Y_2$. The first output sequence $Y_0$, second output sequence $Y_1$ output from the first non-binary convolutional code encoder 150 ($C_1$), and the third output sequence $Y_2$ output from the second non-binary convolutional code encoder 160 ($C_2$) may be transmitted through the channel 170 to a receiving end, such as the communication-signal receiving device 165 for further processing.

Figure 3B:
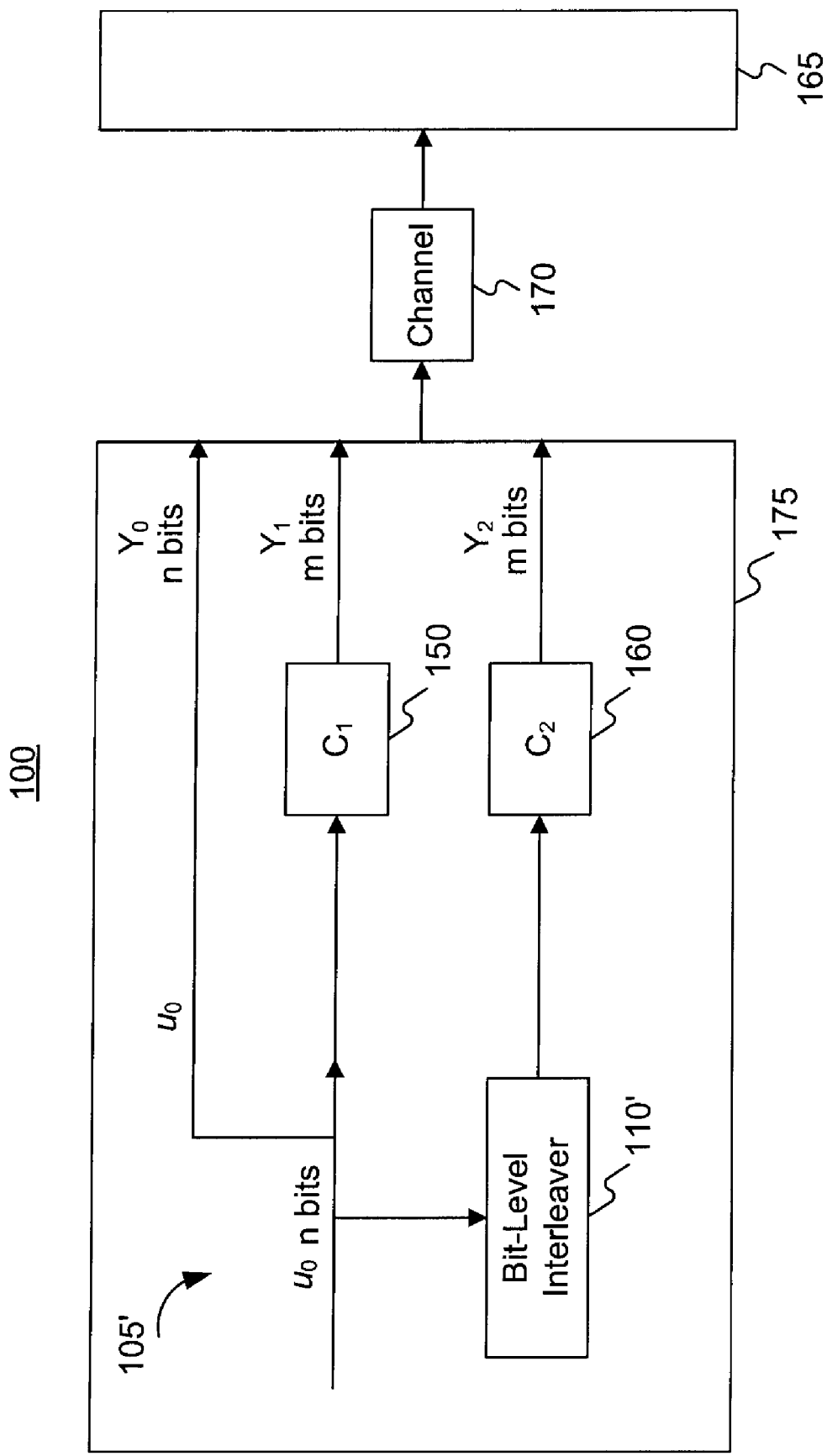
FIG. 3B is a block diagram of an exemplary communication system including a turbo code encoder where a disclosed bit-level interleaver may be employed, consistent with certain disclosed embodiments.

General grouping operations of data may be used in the disclosed bit-level turbo code encoder 105. The first and second grouping blocks 130 and 140 may be implemented in many different ways known in the art. FIG. 3B illustrates a communication system 100 including a transmitter 175 having a bit-level turbo code encoder 105' consistent with some disclosed embodiments, where grouping blocks are not explicitly shown. However, various grouping operations may be implemented in the bit-level turbo code encoder 105'. The bit-level turbo code encoder 105' may include a bit-level interleaver 110', which may be similar to the bit-level interleaver 110 shown in FIG. 3A.

Figure 3C:
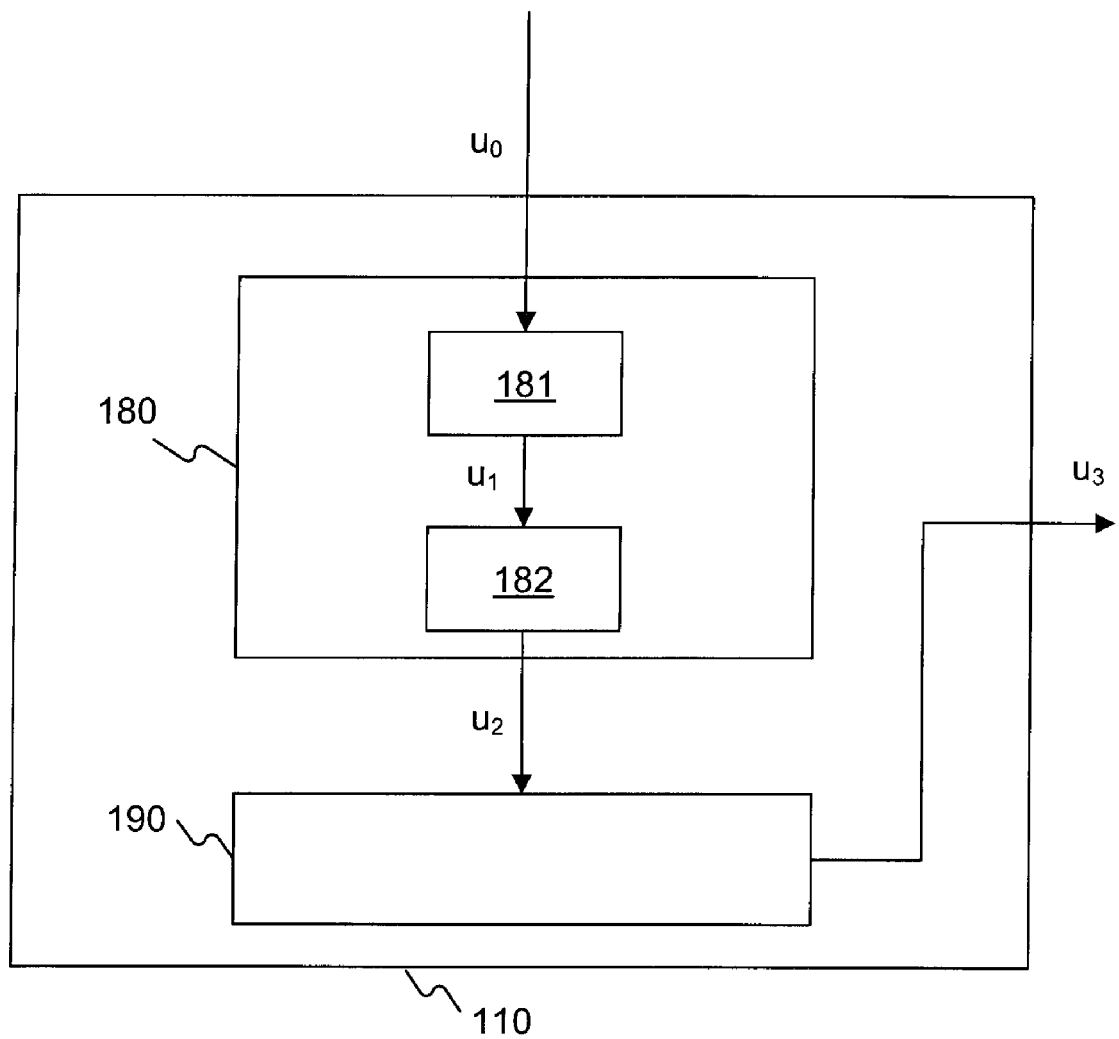
FIG. 3C is a block diagram of an exemplary bit-level interleaver, consistent with certain disclosed embodiments.

Consistent with some embodiments, the disclosed bit-level interleaver 110 (or 110') may also be illustrated in FIG. 3C. The bit-level interleaver 110 (or 110') may include a symbol-level interleaving module 180 and a bit-level interleaving module 190. The symbol-level interleaving module 180 may be configured to permute the first sequence $u_0$ according to a predetermined algorithm and generate a third sequence $u_2$ including a third plurality of data pairs. The bit-level interleaving module 190 may be coupled with the symbol-level interleaving module 180 and configured to permute binary bits of each pair of the third plurality of data pairs into a fourth plurality of data pairs according to a predetermined inter-block permutation function, and generate a fourth sequence $u_3$ including the fourth plurality of data pairs. The symbol-level interleaving module 180 may include a first interleaving module 181. The first interleaving module 181 may be configured to selectively switch binary bits of each pair of the first plurality of data pairs in the first sequence $u_0$ according to the predetermined algorithm and generate a second sequence $u_1$ including a second plurality of data pairs. The symbol-based interleaving module 180 may also include a second interleaving module 182 coupled with the first interleaving module 181 and configured to receive the second sequence $u_1$ including the second plurality of data pairs, and generate the third sequence $u_2$ including the third plurality of data pairs by mapping the second plurality of data pairs into the third plurality of data pairs according to a predetermined mapping function. The detailed process of interleaving the first input sequence $u_0$ will be discussed below.

Referring to Table 3, the input data sequence $u_0$ to the turbo code encoder 105 may be referred to as a first sequence $u_0$, which may include a first plurality of groups of data. In some embodiments, each data group may include a data pair having two or more units of data, such as a data pair (A, B) with two binary bits A and B in some applications. However, the data groups may have more than two bits or two or more units of data in some other applications. The first sequence $u_0$ may be expressed as $u_0=[u_{0,0}, u_{0,1}, u_{0,2}, \ldots, u_{0,M-1}]$, where $u_{0,k}=[(A_{(k,0)}, B_{(k,0)}), (A_{(k,1)}, B_{(k,1)}), (A_{(k,2)}, B_{(k,2)}), \ldots, (A_{(k,N-1)}, B_{(k,N-1)})]$, where k=0, 1, 2, ..., M−1. The first plurality of groups of data may refer to $[(A_{(k,0)}, B_{(k,0)}), (A_{(k,1)}, B_{(k,1)}), (A_{(k,2)}, B_{(k,2)}), \ldots, (A_{(k,N-1)}, B_{(k,N-1)})]$, for k=0, 1, 2, ..., M−1. In Step 1, binary bits A and B in each group of data are selectively switched. That is, if ((j mod 2=1) is satisfied, then $(A_{(i,j)}, B_{(i,j)}) \rightarrow (B_{(i,j)}, A_{(i,j)})$. In other words, a sequence of data units within at least one group of the first plurality of groups of data are selectively altered. The result of Step 1 may be a second sequence $u_1$ including a second plurality of groups of data, e.g., $[(A_{(k,0)}, B_{(k,0)}), (B_{(k,1)}, A_{(k,1)}), (A_{(k,2)}, B_{(k,2)}), \ldots, (B_{(k,N-1)}, A_{(k,N-1)})]$, for k=0, 1, 2, ..., M−1. The second sequence may be expressed as $u_1=[u_{1,0}, u_{1,1}, u_{1,2}, \ldots, u_{1,M-1}]$, where $u_{1,k}=[(A_{(k,0)}, B_{(k,0)}), (B_{(k,1)}, A_{(k,1)}), (A_{(k,2)}, B_{(k,2)}), \ldots, (B_{(k,N-1)}, A_{(k,N-1)})]=[u_{1,k(0)}, u_{1,k(1)}, u_{1,k(2)}, \ldots, u_{1,k(N-1)}]$. The process of Step 1 may be performed, for example, by the first interleaving module 181.

Still referring to Table 3, in Step 2, data groups in the second sequence $u_1$ may be mapped into a third sequence $u_2$ including a third plurality of groups of data through a mapping function P(j), for example, by the second interleaving module 182. The mapping function P(j) may provide the corresponding coordinate (i.e., address or position) of the group of data in the second sequence $u_1$, which is mapped to the $j^{th}$ group of data of the third plurality of groups of data in the third sequence $u_2$. The $j^{th}$ group of data of $u_{2,k}$ equals the $P(j)^{th}$ group of data from $u_{1,k}$, i.e., $u_{2,k}(j)=u_{1,k}(P(j))$. The third sequence $u_2$ may be expressed as $u_2=[u_{2,0}, u_{2,1}, u_{2,2}, \ldots, u_{2,M-1}]$, where $u_{2,k}=[u_{1,k}(P(0)), u_{1,k}(P(1)), u_{1,k}(P(2)), u_{1,k}(P(3)), \ldots, u_{1,k}(P(N-1))]=[(B_{(k,P(0))}, A_{(k,P(0))}), (A_{(k,P(1))}, B_{(k,P(1))}), (B_{(k,P(2))}, A_{(k,P(2))}), (A_{(k,P(3))}, B_{(k,P(3))}), \ldots, (A_{(k,P(N-1))}, B_{(k,P(N-1))})]=[u_2(k,0), u_2(k,1), u_2(k,2), \ldots, u_2(k, 2N-2), u_2(k,2N-1)]$. The third plurality of groups of data may be expressed as $[(B_{(k,P(0))}, A_{(k,P(0))}), (A_{(k,P(1))}, B_{(k,P(1))}), (B_{(k,P(2))}, A_{(k,P(2))}), (A_{(k,P(3))}, B_{(k,P(3))}), \ldots, (A_{(k,P(N-1))}, B_{(k,P(N-1))})]$, where k=0, 1, 2, ..., M−1. The parameters $P_0$, $P_1$, $P_2$, and $P_3$ may reuse those listed in Table 2 that are known in the art for IEEE 802.16 symbol-level interleavers. The process of Step 2 may be performed, for example, by the second interleaving module 182.

Still referring to Table 3, in Step 3, the third sequence $u_2$ including the third plurality of groups of data may further be processed through an inter-block permutation by an inter-block permutation function IBP(i, j) to generate a fourth sequence $U_3$ including a fourth plurality of groups of data. In Step 3, the inter-block permutation function IBP(i, j) provides the corresponding coordinate (or address) of the third sequence $u_{2,k}$ that is mapped into the fourth sequence $u_3$ at address (i, j). That is, $u_3(i,j)=u_2(IBP(i,j),j)$. The inter-block permutation function IBP(i, j) may be selected from Eqs. (4)-(7). The fourth sequence $U_3$ may also be expressed as $u_3=[u_{3,0}, u_{3,1}, u_{3,2}, \ldots, u_{3,M-1}]$, where $u_{3,k}=[u_2(IBP(k,0),0), u_2(IBP(k,1),1), u_2(IBP(k,2),2), \ldots, u_2(IBP(k,2N-2), 2N-2), u_2(IBP(k,2N-1), 2N-1)]=[(B_{(IBP(k,0),P(0))}, A_{(IBP(k,1),P(0))}), (A_{(IBP(k,2),P(1))}, B_{(IBP(k,3),P(1))}), (B_{(IBP(k,4),P(2))}, A_{(IBP(k,5),P(2))}), \ldots, (A_{(IBP(k,2N-2),P(N-1))}, B_{(IBP(k,2N-1),P(N-1))})]$. The fourth plurality of groups of data may be expressed as $[(B_{(IBP(k,0),P(0))}, A_{(IBP(k,1),P(0))}), (A_{(IBP(k,2),P(1))}, B_{(IBP(k,3),P(1))}), (B_{(IBP(k,4),P(2))}, A_{(IBP(k,5),P(2))}), \ldots, (A_{(IBP(k,2N-2),P(N-1))}, B_{(IBP(k,2N-1),P(N-1))})]$, for k=0, 1, 2, ..., M−1.

As shown in Table 3, through the inter-block permutation in Step 3, the first and second units of data (i.e., binary bits) $A_i$ and $B_i$ in a each group of data $(A_i, B_i)$ of the third sequence $u_2$ may be independently permuted among groups in the fourth sequence $u_3$. For example, given an original group of data $(A_1, B_1)$ in $u_2$, binary bit $A_1$ may be permuted into the $9^{th}$ group of data in $u_3$, and may form a group of data $(A_1, B_3)$ with binary bit $B_3$, for example. The binary bit $B_1$ may be permuted into the $11^{th}$ group of data in $u_3$, and may form a group of data $(A_4, B_1)$ with binary bit $A_4$, for example. Therefore, the inter-block permutation may allow for enhanced randomness in the resulting data sequence. The fourth sequence $u_3$ may be output as data having error-correction codes (bit-level turbo codes) configured to allow error correction to a receiving end, e.g., the communication-signal receiving device 165. The fourth sequence $U_3$ may be transmitted to the second non-binary convolutional code encoder 160 ($C_2$) as the input data sequence thereto. The process of Step 3 may be performed, for example, by the bit-level interleaving module 190.

The interleaving process described in Steps 1-3 above may also be realized by a set of instructions recognizable by a data processing device, such as the turbo code encoder 105. The data processing device (e.g., the turbo code encoder 105) may be configured by the instructions to perform operations of interleaving process discussed above. The operations includes receiving a first data sequence including a first plurality of groups of data, each group having at least two units of data (e.g., two binary bits); altering a sequence of data units within at least one group of the first plurality of groups of data to generate a second data sequence including a second plurality of groups of data; and mapping the data of the second plurality of groups into an interleaved sequence to generate a third data sequence including a third plurality of groups of data. The operations may also include: performing an inter-block permutation to the third plurality of groups of data to generate a fourth data sequence comprising a fourth plurality of groups of data; and outputting the fourth plurality of groups of data as data having error-correction codes configured to allow error correction to a receiving end.

The algorithm in Table 3 for the bit-level interleaver 110 (or 110') is an example and does not intend to limit implementations of other suitable algorithms to the bit-level interleaver 110 (or 110'). In addition, the Steps 1-3 may not be necessarily performed in the order of Steps 1-3. For example, the inter-block permutation (originally in Step 3 of Table 3) may be performed prior to those processes in Steps 1-2. Accordingly, the bit-level interleaving module 190 may be placed upstream of the symbol-level interleaving module 180 in FIG. 3C. In many embodiments, the implementation is to interleave a data sequence at the bit-level, such as using an algorithm modified from a conventional algorithm employed in a symbol-level interleaver, by adding an additional inter-block permutation, which selectively permutes binary bits of a group of data independently among the groups to form a new sequence. By doing so, the bit-level interleaver 110 (or 110') may enhance data communication performance, provide backward compatibility, or achieve both in some applications.

Figure 4A:
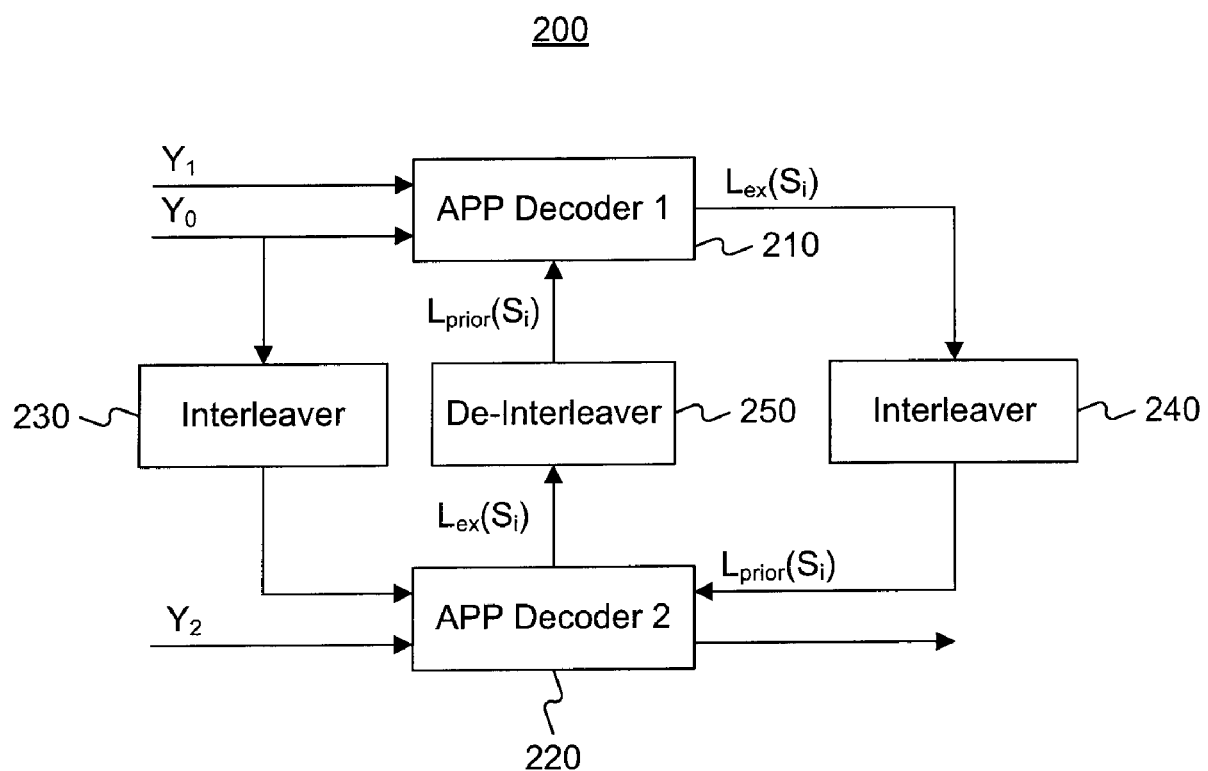
FIG. 4A is a block diagram of an exemplary turbo decoder where a disclosed bit-level interleaver may be employed, consistent with certain disclosed embodiments.

FIG. 4A illustrates an exemplary bit-level turbo decoder 200 consistent with the disclosed embodiments, which may be implemented in the communication-signal receiving device 165 shown in FIG. 3A. The bit-level turbo decoder 200 may include at least one non-binary convolutional code decoder configured to decode a data sequence to generate extrinsic information. The bit-level turbo decoder 200 may also include at least one bit-level interleaver coupled with the at least one non-binary convolutional code decoder and configured to interleave the extrinsic information. The bit-level turbo decoder 200 may also include at least one bit-level de-interleaver coupled with the at least one non-binary convolutional code decoder and configured to perform a reversed operation of bit-level interleaving to the extrinsic information generated by the at least one non-binary convolutional code decoder.

In some embodiments, as shown in FIG. 4A, the bit-level turbo decoder 200 may include a first and a second non-binary convolutional code decoders 210 and 220, a first and a second bit-level interleavers 230 and 240, and a bit-level de-interleaver 250. In some embodiments, the first and second non-binary convolutional code encoders 150 ($C_1$) and 160 ($C_2$) are the same (i.e., having the same structure and function). Therefore the first and second convolutional code decoders 210 and 220 may use the same decoder for decoding, which may reduce the overall complexity of the turbo decoder 200.

Each one of the first and second non-binary convolutional code decoders 210 and 220 may be configured to perform an A Posteriori Probability (APP) decoding process of a data sequence received by the first and second non-binary convolutional code decoders 210 and 220, e.g., a first data sequence $Y_0$, which may correspond to the first output data sequence from the bit-level turbo code encoder 105 shown in FIG. 3A, a second data sequence $Y_1$, which may correspond to the second output data sequence from the bit-level turbo code encoder 105, and extrinsic information (which may include data sequences in bit-level) recovered by and output from the bit-level de-interleaver 250. The first non-binary convolutional code decoder 210 may output extrinsic information at bit-level to the second bit-level interleaver 240. The second bit-level interleaver 240 may interleave the extrinsic information at bit-level, and may output the interleaved extrinsic information as a priori information (which may include data sequences in bit-level) to the second non-binary convolutional code decoder 220. The second non-binary convolutional code decoder 220 may receive interleaved data sequences from the first bit-level interleaver 230, and/or a third data sequence $Y_2$, which may correspond to the third output data sequence from the bit-level turbo code encoder 105. The first bit-level interleaver 230 may interleave the first data sequence $Y_0$, and may output the interleaved data sequence to the second non-binary convolutional code decoder 220. The bit-level de-interleaver 250 may receive the extrinsic information at bit-level decoded by and output from the second non-binary convolutional code decoder 220 and may perform a bit-level de-interleaving process on the received extrinsic information, and further output recovered (i.e., de-interleaved) data sequences to the first non-binary convolutional code decoder 210.

The extrinsic information (denoted as $L_{ex}(S_i)$ in FIG. 4A) generated from the A Posteriori Probability (APP) decoding process may be formatted in symbol form at symbol-level. A symbol-level to bit-level conversion will be performed on the generated extrinsic information for the purpose of bit-level interleaving or de-interleaving. After the bit-level interleaving and de-interleaving, a bit-level to symbol-level conversion is also performed prior to the A Posteriori Probability (APP) decoding process, which converts the a priori information represented at bit-level to symbol-level. Exemplary symbol-level to bit-level conversion and bit-level to symbol-level conversion are described as follows. Assuming a mapping function $\Phi$ maps N binary bits into a symbol $S_m$ as shown in Eq. (8):

$$\Phi: \{b_{m,0}, b_{m,1}, b_{m,2}, \ldots, b_{m,W-1}\} \rightarrow S_m \qquad (8)$$

wherein $b_{m,0}, b_{m,1}, \ldots,$ and $b_{m,W-1}$ are bits of the symbol $S_m$, the extrinsic information may be expressed as:

$$L_{ex}(b_i) = \log(\Sigma_{b_{m,i}=0} \exp^{L_{ex}(S_m)}) - \log(\Sigma_{b_{m,i}=1} \exp^{L_{ex}(S_m)}) \qquad (9),$$

and the a priori information may be expressed as:

$$L_{ex}(S_m) = \Sigma_{i=0}^{W-1} L_{ex}(b_{m,i})(1-b_{m,i}) \qquad (10),$$

where $$L_{ex}(S_m) = \log P_{ex}(S_m) \qquad (11),$$

and $$L_{ex}(b_i) = \log P_{ex}(b_i=0) - \log P_{ex}(b_i=1) \qquad (12),$$

and where $P_{ex}$ is a probability function of extrinsic information.

Figure 4B:
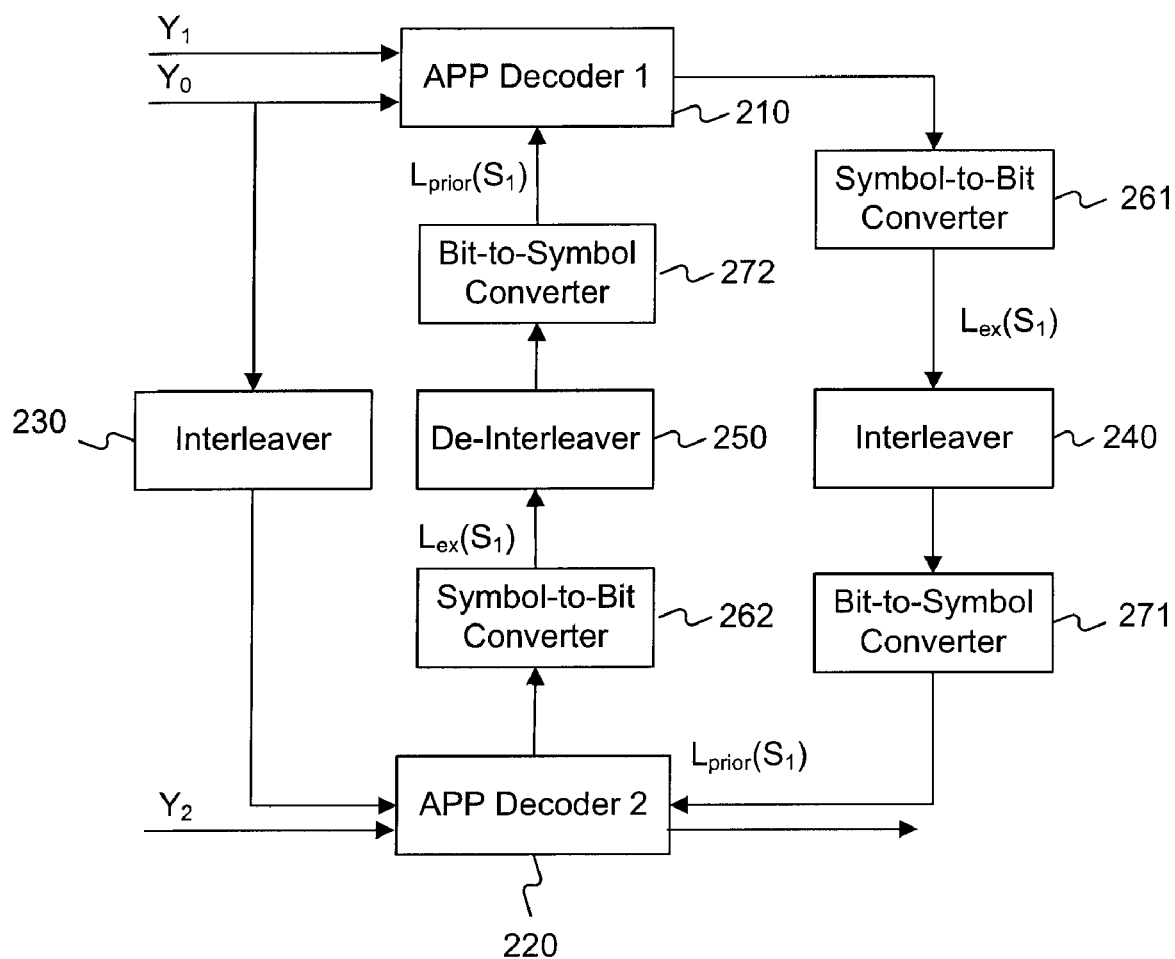
FIG. 4B is a block diagram of an exemplary turbo decoder where a disclosed bit-level interleaver may be employed, consistent with certain disclosed embodiments.

FIG. 4B illustrates another embodiment of the bit-level turbo decoder 200. In addition to components shown in FIG. 4A, the bit-level turbo decoder 200 may further include a first symbol-to-bit converter 261 and a second symbol-to-bit converter 262. The bit-level turbo decoder 200 may also include a first bit-to-symbol converter 271 and a second bit-to-symbol converter 272. The first symbol-to-bit converter 261 may be located between the first non-binary convolutional encoder 210 and the second bit-level interleaver 240, and may be configured to convert the extrinsic information generated by the first non-binary convolutional code decoder 210 from symbol-level to bit-level and transmit the converted extrinsic information at bit-level to the second bit-level interleaver 240. The second symbol-to-bit converter 262 may be located between the second non-binary convolutional code decoder 220 and the bit-level de-interleaver 250, and may be configured to convert the extrinsic information generated by the second non-binary convolutional code decoder 220 from symbol-level to bit-level and transmit the converted extrinsic information at bit-level to the bit-level de-interleaver 250. The first and second symbol-to-bit converters each are configured to perform operations of formatting extrinsic information into binary form at bit level as follows:

$$L_{ex}(b_i) = \log(\Sigma_{b_{m,i}=0} \exp^{L_{ex}(S_m)}) - \log(\Sigma_{b_{m,i}=1} \exp^{L_{ex}(S_m)}),$$
where, $L_{ex}(S_m) = \Sigma_{i=0}^{W-1} L_{ex}(b_{m,i})(1-b_{m,i})$, $L_{ex}(S_m) = \log P_{ex}(S_m)$, $L_{ex}(b_i) = \log P_{ex}(b_i=0) - \log P_{ex}(b_i=1)$, $b_{m,0}, b_{m,1}, \ldots,$ and $b_{m,W-1}$ are binary bits of symbol $S_m$, and $P_{ex}$ is a probability function of the extrinsic information.

The first bit-to-symbol converter 271 may be located between the second bit-level interleaver 240 and the second non-binary convolutional code decoder 220, and may be configured to convert extrinsic information interleaved by the second bit-level interleaver 240 from bit-level to symbol-level, and transmit the converted extrinsic information at symbol-level to the second non-binary convolutional code decoder 220. The second bit-to-symbol converter 272 may be located between the bit-level de-interleaver 250 and the first non-binary convolutional code decoder 210, and may be configured to convert extrinsic information de-interleaved by the bit-level de-interleaver 250 from bit-level to symbol-level, and transmit the converted extrinsic information at symbol-level to the first non-binary convolutional code decoder 210. The first and second bit-to-symbol converters each are configured to perform operations of formatting extrinsic information into symbol form at symbol level as follows:

$$L_{ex}(S_m) = \Sigma_{i=0}^{W-1} L_{ex}(b_{m,i})(1-b_{m,i}), \text{ wherein } L_{ex}(S_m) = \log P_{ex}(S_m),$$

$L_{ex}(b_i) = \log P_{ex}(b_i=0) - \log P_{ex}(b_i=1)$, $b_{m,0}, b_{m,1}, \ldots,$ and $b_{m,W-1}$ are binary bits of symbol $S_m$, and $P_{ex}$ is a probability function of the extrinsic information. The converted extrinsic information from the second bit-level interleaver 240 and the bit-level de-interleaver 250 is then transmitted to the second non-binary convolutional code decoder 220 and the first non-binary convolutional code decoder 210 respectively as a priori information.

Because the bit-level interleaver 110 may be modified from an interleaver compatible with IEEE 802.16 convolutional turbo codes, the disclosed bit-level interleaver 110 may also support backward compatibility. For example, the bit-level interleaver 110 may support 48-bit, 96-bit, and 192-bit sequences defined in IEEE 802.16 standard. Furthermore, because the disclosed bit-level interleaver 110 includes the inter-block permutation step (e.g., Step 3 in the algorithm shown in Table 3), the bit-level interleaver 110 may also support long-length sequences, such as 960-bit, 1920-bit, 2880-bit, 3840-bit, and 4800-bit sequences.

Figure 5:
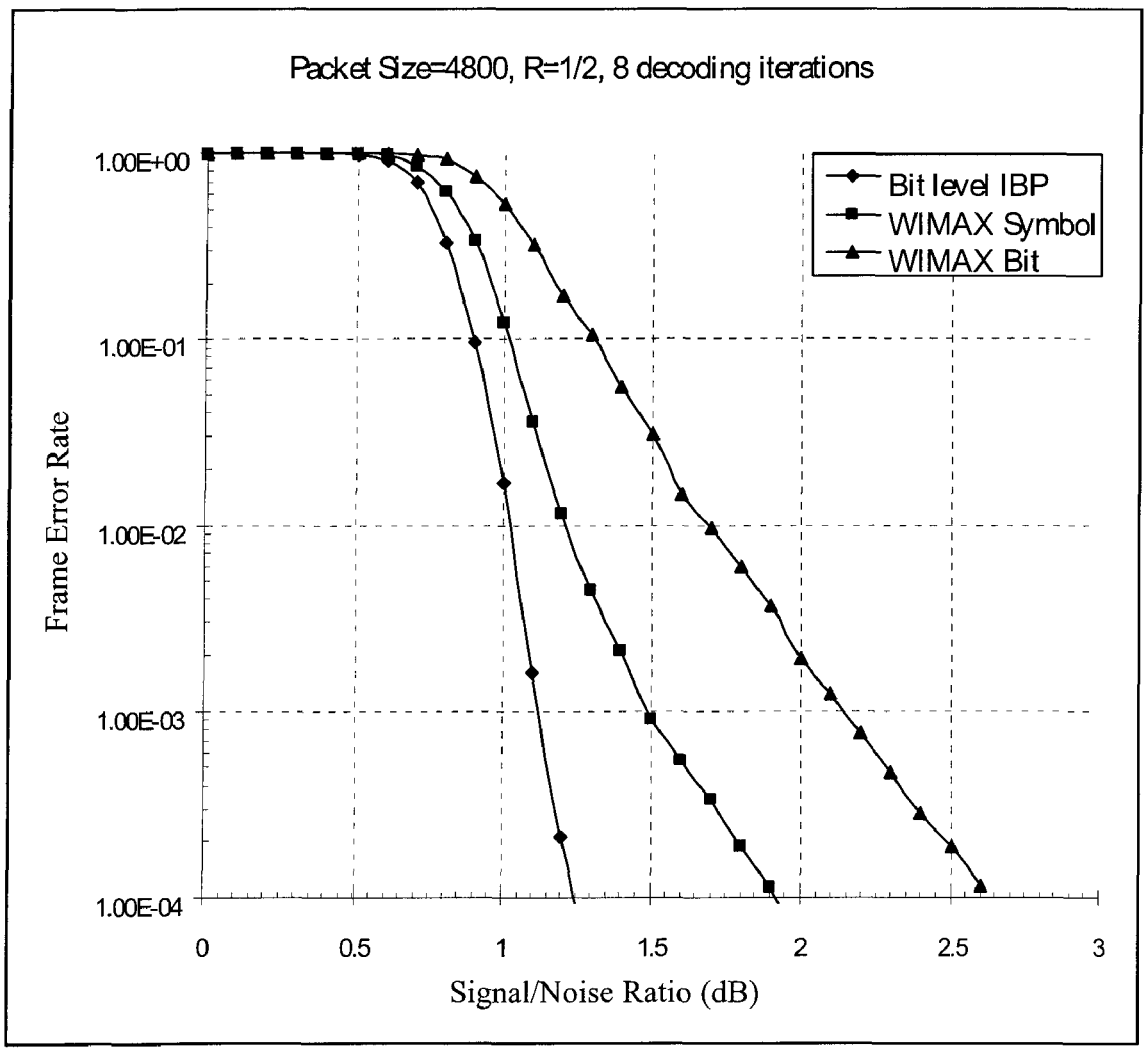
FIG. 5 shows exemplary simulation results comparing the frame error rate between an exemplary bit-level turbo code encoder applying an exemplary bit-level interleaver consistent with certain disclosed embodiments, a turbo code encoder defined in IEEE 802.16 standard applying a bit-level iterative encoding algorithm, and a turbo code encoder defined in IEEE 802.16 standard applying a symbol-level iterative encoding algorithm.

FIG. 5 shows simulation results providing frame error rates comparison between an exemplary bit-level turbo code encoder 105 employing an exemplary bit-level interleaver 110 consistent with one embodiment (labeled as "Bit level IBP" in FIG. 5), a turbo code encoder defined in IEEE 802.16 standard applying a bit-level iterative encoding algorithm (labeled as "WIMAX Bit"), and a turbo code encoder defined in IEEE 802.16 standard applying a symbol-level iterative encoding algorithm (labeled as "WIMAX Symbol"). Equation 3, i.e., IBP(i, j)=(i+Pj) mod M is used as the inter-block permutation function IBP(i, j) in the bit-level interleaver 110. The parameters P and M for the inter-block permutation function IBP(i, j) used in the simulation are shown in Table 4. The packet size is 4800 (i.e., N=2400), and the code rate is R=½. Eight decoding iterations are used in the simulation.

TABLE 4

Inter-block Permutation Parameters

| Interleaver Length (Bits) | P | M | Applied Block Interleaver Defined in IEEE 802.16 (Bytes) |
|---|---|---|---|
| 960 | 5 | 20 | 6 |
| 1920 | 5 | 20 | 12 |
| 2880 | 11 | 15 | 24 |
| 3840 | 11 | 20 | 24 |
| 4800 | 11 | 25 | 24 |

As shown in FIG. 5, the frame error rate may be significantly lower for the case employed with the bit-level interleaver 110 ("Bit level IBP") compared to that of the other two cases when signal to noise ratio is larger than 0.5 dB. In other words, the exemplary bit-level interleaver 110 outperforms the conventional turbo code encoder applying the bit-level iterative encoding algorithm, and the conventional turbo code encoder applying the symbol-level iterative encoding algorithm, for example, when the signal to noise ratio is larger than 0.5 dB. The bit-level interleaver 110 in one embodiment may have less complexity than a conventional symbol-level interleaver, and may provide improved performance for a bit-level turbo code encoder.

It will be apparent to those skilled in the art that various modifications and variations can be made to the bit-level turbo code encoder having bit-level interleaver(s) and the bit-level turbo decoder with and without bit-to-symbol and symbol-to-bit converters. It is intended that the specification and examples be considered as exemplary only, with a true scope of the disclosure being indicated by the following claims and their equivalents.

What is claimed is:

1. A bit-level turbo code encoder configured to receive a first input data sequence and generate a first output data sequence, the bit-level turbo code encoder comprising:
   a first non-binary convolutional code encoder configured to process the first input data sequence and generate a second output data sequence;
   a bit-level interleaver configured to receive the first input data sequence as a first sequence and interleave the first sequence at bit level to generate a fourth sequence; and
   a second non-binary convolutional code encoder coupled with the bit-level interleaver and configured to receive the fourth sequence and process the fourth sequence to generate a third output data sequence.

2. The bit-level turbo code encoder of claim 1, wherein the first sequence includes a first plurality of data pairs, the bit-level interleaver further comprising:
   a symbol-level interleaving module configured to permute at least one data pair of the first plurality of data pairs in the first sequence according to a predetermined algorithm and generate a third sequence including a third plurality of data pairs; and
   a bit-level interleaving module coupled with the symbol-level interleaving module and configured to permute binary bits of at least one data pair of the third plurality of data pairs into a fourth plurality of data pairs according to a predetermined inter-block permutation function, and generate the fourth sequence including the fourth plurality of data pairs.

3. The bit-level turbo code encoder of claim 2, wherein the symbol-level interleaving module comprises:
a first interleaving module configured to selectively switch binary bits of at least one data pair of the first plurality of data pairs in the first sequence according to a predetermined algorithm and generate a second sequence including a second plurality of data pairs.

4. The bit-level turbo code encoder of claim 3, wherein the symbol-level interleaving module further comprises:
a second interleaving module coupled with the first interleaving module and configured to receive the second sequence including the second plurality of data pairs, and generate the third sequence including the third plurality of data pairs by mapping the second plurality of data pairs into the third plurality of data pairs according to a predetermined mapping function.

5. The bit-level turbo code encoder of claim 2, wherein the predetermined inter-block permutation function, denoted as IBP(i,j), comprises one of:
IBP(i, j)=(i+Pj) mod M,
IBP(i, j)=(i+f$_2$j+f$_1$ j) mod M,
IBP(i, j)=(i+j P+A+Pα (j mod c)+β (j mod c)) mod M,
IBP(i, j)=(i+j P−(j−(j mod q))/q) mod M, q=P/(gcd (P, M)), and
IBP(i, j)=(i+j P+(j−(j mod q))/q) mod M, q=P/(gcd (P, M)), wherein gcd(P,M) is the greatest common divisor.

6. The bit-level turbo code encoder of claim 5, wherein the parameters P and M in the inter-block permutation function IBP(i, j) comprises the following based on an interleaver length:

| Interleaver Length (Bits) | P | M |
|---|---|---|
| 960 | 5 | 20 |
| 1920 | 5 | 20 |
| 2880 | 11 | 15 |
| 3840 | 11 | 20 |
| 4800 | 11 | 25. |

7. The bit-level turbo code encoder of claim 1, wherein the bit-level interleaver is an Almost Regular Permutation (ARP) interleaver.

8. The bit-level turbo code encoder of claim 1, wherein the bit-level interleaver is a Quadratic Polynomial Permutation (QPP) interleaver.

9. The bit-level turbo code encoder of claim 1, further comprising at least one grouping block configured to group binary bits into data pairs.

10. A bit-level inter-block permutation interleaving method, comprising:
receiving a first data sequence comprising a first plurality of groups of data, each group having at least two units of data;
altering a sequence of data units within at least one group of the first plurality of groups of data to generate a second data sequence comprising a second plurality of groups of data;
mapping the data of the second plurality of groups into an interleaved sequence to generate a third data sequence comprising a third plurality of groups of data;
performing an inter-block permutation to the third plurality of groups of data to generate a fourth data sequence comprising a fourth plurality of groups of data; and
outputting the fourth plurality of groups of data as data having error-correction codes configured to allow error correction to a receiving end.

11. The bit-level inter-block permutation interleaving method of claim 10, wherein
the first plurality of groups of data comprise [(A$_{(k,0)}$,B$_{(k,0)}$), (A$_{(k,1)}$,B$_{(k,1)}$), (A$_{(k,2)}$,B$_{(k,2)}$), ..., (A$_{(k,N-1)}$,B$_{(k,N-1)}$)], for k=0, 1, ..., M−1;
the first sequence comprises u$_0$=[u$_{0,0}$, u$_{0,1}$, u$_{0,2}$, ..., u$_{0,M-1}$], with u$_{i,j}$=(A$_{(i,j)}$,B$_{(i,j)}$) for i=0, 1, ..., M−1 and for j=0, 1, ..., N−1 and with M and N being integers; and
altering the sequence of data units within at least one group of the first plurality of groups of data comprises switching (A$_{(i,j)}$, B$_{(i,j)}$) into (B$_{(i,j)}$, A$_{(i,j)}$) if 0 mod 2=1) is satisfied for i=0, 1, ..., M−1 and for j=0, 1, ..., N−1.

12. The bit-level inter-block permutation interleaving method of claim 10, wherein
the second plurality of groups of data comprise [(A$_{(k,0)}$, B$_{(k,0)}$), (B$_{(k,1)}$, A$_{(k,1)}$), (A$_{(k,2)}$, B$_{(k,2)}$), ..., (B$_{(k,N-1)}$, A$_{(k,N-1)}$)], for k=0, 1, 2, ..., M−1;
the second sequence comprises u$_1$=[u$_{1,0}$, u$_{1,1}$, u$_{1,2}$, ..., u$_{1,M-1}$], wherein u$_{1,k}$=[(A$_{(k,0)}$, B$_{(k,0)}$), (B$_{(k,1)}$, A$_{(k,1)}$), (A$_{(k,2)}$, B$_{(k,2)}$), ..., (B$_{(k,N-1)}$, A$_{(k,N-1)}$)], for k=0, 1, 2, ..., M−1; and
mapping the data of the second plurality of groups into the interleaved sequence comprises mapping the P(j)$^{th}$ group of the second plurality of groups of data into the j$^{th}$ group position of the third data sequence, P(j) being a mapping function of:
for j=0, 1, ..., N−1
switch (j mod 4):
case 0: P (j)=(P$_0$ j+1) mod N
case 1: P (j)=(P$_0$ j+1+N/2+P$_1$) mod N
case 2: P (j)=(P$_0$ j+1+P$_2$) mod N
case 3: P (j)=(P$_0$ j+1+N/2+P$_3$) mod N,
the third data sequence being u$_2$=[u$_{2,0}$, u$_{2,1}$, u$_{2,2}$, ..., u$_{2,M-1}$], where u$_{2,k}$=[u$_{1,k}$(P(0)), u$_{1,k}$(P(1)), u$_{1,k}$(P(2)), u$_{1,k}$(P(3)), ..., u$_{1,k}$(P(N−1))]=[(B$_{(k,P(0))}$, A$_{(k,P(0))}$), (A$_{(k,P(1))}$, B$_{(k,P(1))}$), (B$_{(k,P(2))}$, A$_{(k,P(2))}$), (A$_{(k,P(3))}$, B$_{(k,P(3))}$), ..., (A$_{(k,P(N-1))}$, B$_{(k,P(N-1))}$)]=[u$_2$(k,0), u$_2$(k,1), u$_2$(k,2), ..., u$_2$(k,2N−2), u$_2$(k, 2N−1)].

13. The bit-level inter-block permutation interleaving method of claim 10, wherein performing the inter-block permutation to the third plurality of groups of data comprises permuting the at least two units of data of each group of the third plurality of groups independently among the groups according to an inter-block permutation function.

14. The bit-level inter-block permutation interleaving method of claim 13, wherein
permuting the at least two units of data within each group includes mapping the at least two units of data within each group in the third sequence u$_{2,k}$ to the fourth sequence u$_{3,k}$ according to an inter-block permutation function IBP(i,j) such that u$_3$(i,j)=u$_2$(IBP(i,j),j), and
the third sequence comprises u$_3$=[u$_{3,0}$, u$_{3,1}$, u$_{3,2}$, ..., u$_{3,M-1}$] and u$_{3,k}$=[u$_2$(IBP(k,0), 0), u$_2$(IBP(k,1), 1), u$_2$(IBP(k,2), 2), ..., u$_2$(IBP(k,2N−2), 2N−2), u$_2$(IBP(k, 2N−1), 2N−1)]=[(B$_{(IBP(k,0),P(0))}$, A$_{(IBP(k,1),P(0))}$), (A$_{(IBP(k,2),P(1))}$, B$_{(IBP(k,3),P(1))}$), (B$_{(IBP(k,4),P(2))}$, A$_{(IBP(k,5),P(2))}$), ..., (A$_{(IBP(k,2N-2),P(N-1))}$, B$_{(IBP(k,2N-1),P(N-1))}$)], for k=0, 1, 2, ..., M−1.

15. The bit-level inter-block permutation interleaving method of claim 14, wherein the inter-block permutation function comprises one of:
IBP(i, j)=(i+P j) mod M,
IBP(i, j)=(i+f$_2$ j$^2$+f$_1$ j) mod M,
IBP(i, j)=(i+j P+A+P α (j mod c)+β(j mod c)) mod M, IBP(i, j)=(i+j P−(j−(j mod q))/q) mod M, q=P/(gcd (P, M)), and IBP(i, j)=(i+j P+(j−(j mod q))/q) mod M, q=P/(gcd (P, M)), wherein gcd(P,M) is the greatest common divisor.

16. The bit-level inter-block permutation interleaving method of claim 15, wherein the parameters P and M in the inter-block permutation function IBP(i, j) comprises the following based on an interleaver length:

| Interleaver Length (Bits) | P | M |
|---|---|---|
| 960 | 5 | 20 |
| 1920 | 5 | 20 |
| 2880 | 11 | 15 |
| 3840 | 11 | 20 |
| 4800 | 11 | 25. |

17. A set of instructions recognizable by a data processing device, the instructions configuring the data processing device to perform operations of:
receiving a first data sequence comprising a first plurality of groups of data, each group having at least two units of data;
altering a sequence of data units within at least one group of the first plurality of groups of data to generate a second data sequence comprising a second plurality of groups of data;
mapping the data of the second plurality of groups into an interleaved sequence to generate a third data sequence comprising a third plurality of groups of data;
performing an inter-block permutation to the third plurality of groups of data to generate a fourth data sequence comprising a fourth plurality of groups of data; and
outputting the fourth plurality of groups of data as data having error-correction codes configured to allow error correction to a receiving end.

18. The set of interleaving instructions of claim 17, wherein
the first plurality of groups of data comprise [$(A_{(k,0)}, B_{(k,0)})$, $(A_{(k,1)}, B_{(k,1)})$, $(A_{(k,2)}, B_{(k,2)})$, . . . , and $(A_{(k,N-1)}, B_{(k,N-1)})$], for k=0, 1, . . . , M−1;
the first sequence comprises $u_0=[u_{0,0}, u_{0,1}, u_{0,2}, \ldots, u_{0,M-1}]$, with $u_{i,j}=(A_{(i,j)}, B_{(i,j)})$ for i=0, 1, . . . , M−1 and for j=0, 1, . . . , N−1 and with M and N being integers; and
altering the sequence of data units within at least one group of the first plurality of groups of data comprises switching $(A_{(i,j)}, B_{(i,j)})$ into $(B_{(i,j)}, A_{(i,j)})$ if (j mod 2=1) is satisfied for i=0, 1, . . . , M−1 and for j=0, 1, . . . , N−1.

19. The set of interleaving instructions of claim 17, wherein
the second plurality of groups of data comprise [$(A_{(k,0)}, B_{(k,0)})$, $(B_{(k,1)}, A_{(k,1)})$, $(A_{(k,2)}, B_{(k,2)})$, . . . , $(B_{(k,N-1)}, A_{(k,N-1)})$], for k=0, 1, 2, . . . , M−1;
the second sequence comprises $u_1=[u_{1,0}, u_{1,1}, u_{1,2}, \ldots, u_{1,M-1}]$, wherein $u_{1,k}=[(A_{(k,0)}, B_{(k,0)}), (B_{(k,1)}, A_{(k,1)}), (A_{(k,2)}, B_{(k,2)}), \ldots, (B_{(k,N-1)}, A_{(k,N-1)})]$, for k=0, 1, 2, . . . , M−1; and
mapping the data of the second plurality of groups into the interleaved sequence comprises mapping the P(j)$^{th}$ group of the second plurality of groups of data into the j$^{th}$ group position of the third data sequence, P(j) being a mapping function of:
for j=0, 1, . . . , N−1
switch (j mod 4):
case 0: P (j)=($P_0$ j+1) mod N
case 1: P (j)=($P_0$ j+1+N/2+$P_1$) mod N
case 2: P (j)=($P_0$ j+1+$P_2$) mod N
case 3: P (j)=($P_0$ j+1+N/2+$P_3$) mod N, the third data sequence being $u_2=[u_{2,0}, u_{2,1}, u_{2,2}, \ldots, u_{2,M-1}]$, where $u_{2,k}=[u_{1,k}(P(0)), u_{1,k}(P(1)), u_{1,k}(P(2)), u_{1,k}(P(3)), \ldots, u_{1,k}(P(N-1))]=[(B_{(k,P(0))}, A_{k,P(0)}), (A_{k,P(1)}, B_{(k,P(1))}), (B_{(k,P(2))}, A_{k,P(2)}), (A_{(k,P(3))}, B_{(k,P(3))}), \ldots, (A_{k,P(N-1)}, B_{(k,P(N-1))})]=[u_2(k,0), u_2(k,1), u_2(k,2), \ldots, u_2(k,2N-2), u_2(k, 2N-1)]$.

20. The set of interleaving instructions of claim 17, wherein performing the inter-block permutation to the third plurality of groups of data comprises permuting the at least two units of data of each group of the third plurality of groups independently among the groups according to an inter-block permutation function.

21. The set of interleaving instructions of claim 20, wherein
permuting the at least two units of data within each group includes mapping the at least two units of data within each group in the third sequence $u_{2,k}$ to the fourth sequence $u_{3,k}$ according to an inter-block permutation function IBP(i,j) as $u_3(i,j)=u_2(IBP(i,j),j)$, and
the third sequence comprises $u_3=[u_{3,0}, u_{3,1}, u_{3,2}, \ldots, u_{3,M-1}]$ and $u_{3,k}=[u_2(IBP(k,0), 0), u_2(IBP(k,1), 1), u_2(IBP(k,2), 2), \ldots, u_2(IBP(k,2N-2), 2N-2), u_2(IBP(k,2N-1), 2N-1)]=[(B_{(IBP(k,0),P(0))}, A_{(IBP(k,1),P(0))}), (A_{(IBP(k,2),P(1))}, B_{(IBP(k,3),P(1))}), (B_{(IBP(k,4),P(2))}, A_{(IBP(k,5),P(2))}), \ldots, (A_{(IBP(k,2N-2),P(N-1))}, B_{(IBP(k,2N-1),P(N-1))})]$, for k=0, 1, 2, . . . , M−1.

22. The set of interleaving instructions of claim 21, wherein the inter-block permutation function comprises one of:
IBP(i, j)=(i+P j) mod M,
IBP(i, j)=(i+$f_2$ j$^2$+$f_1$ j) mod M,
IBP(i, j)=(i+j P+A+P α (j mod c)+β (j mod c)) mod M,
IBP(i, j)=(i+j P−(j−(j mod q))/q) mod M, q=P/(gcd (P, M)), and
IBP(i, j)=(i+j P+(j−(j mod q))/q) mod M, q=P/(gcd (P, M)), wherein gcd(P,M) is the greatest common divisor.

23. The set of interleaving instructions of claim 22, wherein the parameters P and M in the inter-block permutation function IBP(i, j) comprises the following based on an interleaver length:

| Interleaver Length (Bits) | P | M |
|---|---|---|
| 960 | 5 | 20 |
| 1920 | 5 | 20 |
| 2880 | 11 | 15 |
| 3840 | 11 | 20 |
| 4800 | 11 | 25. |

24. A bit-level turbo decoder, comprising:
at least one non-binary convolutional code decoder configured to decode a data sequence to generate extrinsic information;
at least one bit-level interleaver coupled with the at least one non-binary convolutional code decoder and configured to interleave the extrinsic information; and
at least one bit-level de-interleaver coupled with the at least one non-binary convolutional code decoder and configured to perform a reversed operation of bit-level interleaving to the extrinsic information generated by the at least one non-binary convolutional code decoder.

25. The bit-level turbo decoder of claim 24, wherein the at least one bit-level interleaver is configured to receive a first sequence including a first plurality of data pairs and interleave the first sequence to generate a fourth sequence including a fourth plurality of data pairs, the at least one bit-level interleaver comprising:

a symbol-level interleaving module configured to permute at least one data pair of the first plurality of data pairs in the first sequence according to a predetermined algorithm and generate a third sequence including a third plurality of data pairs; and a bit-level interleaving module coupled with the symbol-level interleaving module and configured to permute binary bits of at least one data pair of the third plurality of data pairs into the fourth plurality of data pairs according to a predetermined inter-block permutation function, and generate the fourth sequence including the fourth plurality of data pairs.

26. The bit-level turbo decoder of claim 25, wherein the symbol-level interleaving module comprises:

a first interleaving module configured to selectively switch binary bits of at least one data pair of the first plurality of data pairs in the first sequence according to a predetermined algorithm and generate a second sequence including a second plurality of data pairs.

27. The bit-level turbo decoder of claim 26, wherein the symbol-level interleaving module further comprises:

a second interleaving module coupled with the first interleaving module and configured to receive the second sequence including the second plurality of data pairs, and generate the third sequence including the third plurality of data pairs by mapping the second plurality of data pairs into the third plurality of data pairs according to a predetermined mapping function.

28. The bit-level turbo decoder of claim 25, wherein the predetermined inter-block permutation function, denoted as IBP(i,j), comprises one of:

IBP(i, j)=(i+P j) mod M,
IBP(i, j)=(i+$f_2$ $j^2$+$f_1$ j) mod M,
IBP(i, j)=(i+j P+A+P α (j mod c)+β (j mod c)) mod M,
IBP(i, j)=(i+j P−(j mod q)/q) mod M, q=P/(gcd (P, M)), and
IBP(i, j)=(i+j P+(j−(j mod q))/q) mod M, q=P/(gcd (P, M)), wherein gcd(P,M) is the greatest common divisor.

29. The bit-level turbo decoder of claim 28, wherein the parameters P and M in the inter-block permutation function IBP(i, j) comprises the following based on an interleaver length:

| Interleaver Length (Bits) | P | M |
|---|---|---|
| 960 | 5 | 20 |
| 1920 | 5 | 20 |
| 2880 | 11 | 15 |
| 3840 | 11 | 20 |
| 4800 | 11 | 25. |

30. The bit-level turbo decoder of claim 24, wherein the at least one bit-level interleaver is an Almost Regular Permutation (ARP) interleaver.

31. The bit-level turbo decoder of claim 24, wherein the at least one bit-level interleaver is a Quadratic Polynomial Permutation (QPP) interleaver.

32. The bit-level turbo decoder of claim 24, wherein the at least one non-binary convolutional code decoder is configured to perform an A Posteriori Probability (APP) decoding of a data sequence.

33. The bit-level turbo decoder of claim 24, wherein the at least one non-binary convolutional code decoder comprises:

a first non-binary convolutional code decoder coupled with the bit-level de-interleaver and configured to perform an A Posteriori Probability (APP) decoding of a data sequence to generate extrinsic information at bit-level and transmit the generated extrinsic information at bit-level to the at least one bit-level interleaver; and a second non-binary convolutional code decoder coupled with the at least one bit-level de-interleaver and configured to perform the APP decoding of a data sequence to generate extrinsic information at bit-level and transmit the generated extrinsic information at bit-level to the at least one bit-level de-interleaver.

34. The bit-level turbo decoder of claim 24, wherein the at least one non-binary convolutional code decoder comprises a first and a second non-binary convolutional code decoder each coupled with the at least one bit-level de-interleaver and configured to perform an A Posteriori Probability (APP) decoding of a data sequence to generate extrinsic information at symbol-level, the bit-level turbo decoder further comprising:

a first symbol-to-bit converter configured to convert the extrinsic information generated by the first non-binary convolutional code decoder from symbol-level to bit-level and transmit the converted extrinsic information at bit-level to the at least one bit-level interleaver; and a second symbol-to-bit converter configured to convert the extrinsic information generated by the second non-binary convolutional code decoder from symbol-level to bit-level and transmit the converted extrinsic information at bit-level to the at least one bit-level de-interleaver.

35. The bit-level turbo decoder of claim 34, further comprising:

a first bit-to-symbol converter configured to convert extrinsic information interleaved by the at least one bit-level interleaver from bit-level to symbol-level, and transmit the converted extrinsic information at symbol-level to the second non-binary convolutional code decoder; and a second bit-to-symbol converter configured to convert extrinsic information de-interleaved by the at least one bit-level de-interleaver from bit-level to symbol-level, and transmit the converted extrinsic information at symbol-level to the first non-binary convolutional code decoder.

36. The bit-level turbo decoder of claim 35, wherein the first and second bit-to-symbol converters each are configured to perform operations of formatting extrinsic information into symbol form at symbol level as follows:

$L_{ex}(S_m) = \Sigma_{i=0}^{W-1} L_{ex}(b_{m,i})(1-b_{m,i})$, wherein $L_{ex}(S_m) = \log P_{ex}(S_m)$, $L_{ex}(b_i) = \log P_{ex}(b_i=0) - \log P_{ex}(b_i=1)$, and where $b_{m,0}$, $b_{m,1}$, ..., and $b_{m,W-1}$ are binary bits of symbol $S_m$, and $P_{ex}$ is a probability function of the extrinsic information.

37. The bit-level turbo decoder of claim 34, wherein the first and second symbol-to-bit converters each are configured to perform operations of formatting extrinsic information into binary form at bit level as follows:

$L_{ex}(b_i) = \log(\Sigma_{b_{m,i}=0} \exp^{L_{ex}(S_m)}) - \log(\Sigma_{b_{m,i}=1} \exp^{L_{ex}(S_m)})$, where, $L_{ex}(S_m) = \Sigma_{i=0}^{W-1} L_{ex}(b_{m,i})(1-b_{m,i}), L_{ex}(S_m) = \log P_{ex}(S_m)$, $L_{ex}(b_i) = \log P_{ex}(b_i=0) - \log P_{ex}(b_i=1)$, and where $b_{m,0}$, $b_{m,1}$, ..., and $b_{m,W-1}$ are binary bits of symbol $S_m$, and $P_{ex}$ is a probability function of the extrinsic information.

\* \* \* \* \*

UNITED STATES PATENT AND TRADEMARK OFFICE
CERTIFICATE OF CORRECTION

PATENT NO. : 7,873,897 B2
APPLICATION NO. : 12/203709
DATED : January 18, 2011
INVENTOR(S) : Yan-Xiu Zheng Page 1 of 1

It is certified that error appears in the above-identified patent and that said Letters Patent is hereby corrected as shown below:

IN THE CLAIMS:
Claim 36, col. 20, line 46 and claim 37, col. 20, line 56, $$L_{ex}(S_m) = \Sigma_{i=0}^{W-1} L_{ex}(b_{m,i})(1-b_{m,i}),$$

should read $$\text{-- } L_{ex}(S_m) = \sum_{i=0}^{W-1} L_{ex}(b_{m,i})(1-b_{m,i}) \text{ --}.$$

Signed and Sealed this
Tenth Day of May, 2011

David J. Kappos
*Director of the United States Patent and Trademark Office*